(12) United States Patent
Pallikkara Kuttiatoor et al.

(10) Patent No.: US 9,422,455 B2
(45) Date of Patent: Aug. 23, 2016

(54) CMP COMPOSITIONS EXHIBITING REDUCED DISHING IN STI WAFER POLISHING

(71) Applicant: Cabot Microelectronics Corporation, Aurora, IL (US)

(72) Inventors: Sudeep Pallikkara Kuttiatoor, Aurora, IL (US); Kevin Dockery, Aurora, IL (US); Prativa Pandey, Aurora, IL (US); Renhe Jia, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 73 days.

(21) Appl. No.: 14/568,311

(22) Filed: Dec. 12, 2014

(65) Prior Publication Data
US 2016/0168421 A1    Jun. 16, 2016

(51) Int. Cl.
C09G 1/02 (2006.01)
H01L 21/311 (2006.01)
C03C 15/00 (2006.01)
C23F 1/16 (2006.01)

(52) U.S. Cl.
CPC . *C09G 1/02* (2013.01); *C03C 15/00* (2013.01); *C23F 1/16* (2013.01); *H01L 21/31111* (2013.01)

(58) Field of Classification Search
None
See application file for complete search history.

(56) References Cited

U.S. PATENT DOCUMENTS

| | | | | |
|---|---|---|---|---|
| 7,161,247 B2 * | 1/2007 | De Rege Thesauro | .. | C09G 1/02 257/741 |
| 8,906,252 B1 * | 12/2014 | Dockery | ............... | B24B 37/044 216/89 |
| 9,165,489 B2 * | 10/2015 | Li | ..................... | H01L 21/31053 |
| 2006/0024967 A1 * | 2/2006 | De Rege Thesauro | .. | C09G 1/02 438/692 |
| 2014/0051335 A1 * | 2/2014 | Morinaga | ............. | B24B 37/044 451/41 |
| 2014/0346140 A1 * | 11/2014 | Dockery | ............... | B24B 37/044 216/38 |
| 2014/0349483 A1 * | 11/2014 | Li | ..................... | H01L 21/31053 438/693 |

\* cited by examiner

*Primary Examiner* — Allan Olsen
(74) *Attorney, Agent, or Firm* — Thomas Omholt; Arlene Harnilla; Francis J. Koszyk

(57) ABSTRACT

The invention provides a chemical-mechanical polishing composition containing a ceria abrasive, an ionic polymer of formula I:

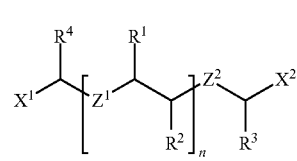

wherein $X^1$ and $X^2$, $Z^1$ and $Z^2$, $R^1$, $R^2$, $R^3$, and $R^4$, and n are as defined herein, a polyhydroxy aromatic compound, a polyvinyl alcohol, and water, wherein the polishing composition has a pH of about 1 to about 4.5. The invention further provides a method of chemically-mechanically polishing a substrate with the inventive chemical-mechanical polishing composition. Typically, the substrate contains silicon oxide, silicon nitride, and/or polysilicon.

21 Claims, No Drawings

CMP COMPOSITIONS EXHIBITING REDUCED DISHING IN STI WAFER POLISHING

BACKGROUND OF THE INVENTION

Compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. Polishing compositions are typically used in conjunction with polishing pads (e.g., a polishing cloth or disk). Instead of, or in addition to, being suspended in the polishing composition, the abrasive material may be incorporated into the polishing pad.

As a method for isolating elements of a semiconductor device, a great deal of attention is being directed towards a shallow trench isolation (STI) process where a silicon nitride layer is formed on a silicon substrate, shallow trenches are formed via etching or photolithography, and a dielectric layer (e.g., an oxide) is deposited to fill the trenches. Due to variation in the depth of trenches, or lines, formed in this manner, it is typically necessary to deposit an excess of dielectric material on top of the substrate to ensure complete filling of all trenches. The excess dielectric material is then typically removed by a chemical-mechanical planarization process to expose the silicon nitride layer. When the silicon nitride layer is exposed, the largest area of the substrate exposed to the chemical-mechanical polishing composition comprises silicon nitride, which must then be polished to achieve a highly planar and uniform surface.

Generally, past practice has been to emphasize selectivity for oxide polishing in preference to silicon nitride polishing. Thus, the silicon nitride layer has served as a stopping layer during the chemical-mechanical planarization process, as the overall polishing rate decreased upon exposure of the silicon nitride layer.

Recently, selectivity for oxide polishing in preference to polysilicon polishing has also been emphasized. For example, the addition of a series of BRIJ™ and polyethylene oxide surfactants, as well as PLURONIC™ L-64, an ethylene oxide-propylene oxide-ethylene oxide triblock copolymer with an HLB of 15, is purported to increase the polishing selectivity of oxide to polysilicon (see Lee et al., "Effects of Nonionic Surfactants on Oxide-to-Polysilicon Selectivity during Chemical Mechanical Polishing," J Electrochem. Soc., 149(8): G477-G481 (2002)). Also, U.S. Pat. No. 6,626,968 discloses that polishing selectivity of silicon oxide to polysilicon can be improved through the use of a polymer additive having hydrophilic and hydrophobic functional groups selected from polyvinylmethylether, polyethylene glycol, polyoxyethylene 23 lauryl ether, polypropanoic acid, polyacrylic acid, and polyether glycol bis(ether).

The STI substrate is typically polished using a conventional polishing medium and an abrasive-containing polishing composition. However, polishing STI substrates with conventional polishing media and abrasive-containing polishing compositions has been observed to result in overpolishing of the substrate surface or the formation of recesses in the STI features and other topographical defects such as microscratches on the substrate surface. This phenomenon of overpolishing and forming recesses in the STI features is referred to as dishing. Dishing is undesirable because dishing of substrate features may detrimentally affect device fabrication by causing failure of isolation of transistors and transistor components from one another, thereby resulting in short-circuits. Additionally, overpolishing of the substrate may also result in oxide loss and exposure of the underlying oxide to damage from polishing or chemical activity, which detrimentally affects device quality and performance.

Thus, there remains a need in the art for polishing compositions and methods that can provide desirable selectivity of silicon oxide, silicon nitride, and polysilicon and that have suitable removal rates, low defectivity, and suitable dishing performance.

BRIEF SUMMARY OF THE INVENTION

The invention provides a chemical-mechanical polishing composition comprising (a) a wet-process ceria abrasive, (b) an ionic polymer of formula (I):

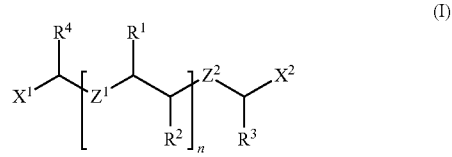

wherein $X^1$ and $X^2$ are independently selected from hydrogen, —OH, and —COOH and wherein at least one of $X^1$ and $X^2$ is —COOH, $Z^1$ and $Z^2$ are independently O or S, $R^1$, $R^2$, $R^3$, and $R^4$ are independently selected from hydrogen, $C_1$-$C_6$ alkyl, and $C_7$-$C_{10}$ aryl, and n is an integer of about 3 to about 500, (c) a polyhydroxy aromatic compound, (d) a polyvinyl alcohol, and (e) water, wherein the polishing composition has a pH of about 1 to about 4.5.

The invention also provides a method of chemically-mechanically polishing a substrate comprising (i) contacting a substrate with a polishing pad and a chemical-mechanical polishing composition comprising (a) a wet-process ceria abrasive, (b) an ionic polymer of formula (I):

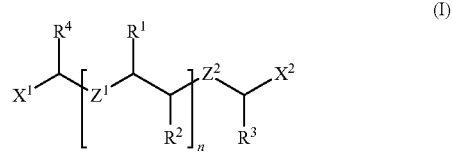

wherein $X^1$ and $X^2$ are independently selected from hydrogen, —OH, and —COOH $Z^1$ and $Z^2$ are independently O or S, $R^1$, $R^2$, $R^3$, and $R^4$ are independently selected from hydrogen, $C_1$-$C_6$ alkyl, and $C_7$-$C_{10}$ aryl, and n is an integer of about 3 to about 500, (c) a polyhydroxy aromatic compound, (d) a polyvinyl alcohol, and (e) water, wherein the polishing composition has a pH of about 1 to about 4.5, (ii) moving the polishing pad and the chemical-mechanical polishing composition relative to the substrate, and (iii) abrading at least a portion of the substrate to polish the substrate.

DETAILED DESCRIPTION OF THE INVENTION

The invention provides a chemical-mechanical polishing composition comprising, consisting essentially of, or consisting of (a) a wet-process ceria abrasive, (b) an ionic polymer of formula (I):

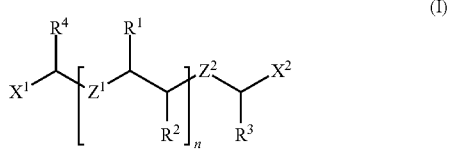

(I)

wherein $X^1$ and $X^2$ are independently selected from hydrogen, —OH, and —COOH and wherein at least one of $X^1$ and $X^2$ is —COOH, $Z^1$ and $Z^2$ are independently O or S, $R^1$, $R^2$. $R^3$, and $R^4$ are independently selected from hydrogen, $C_1$-$C_6$ alkyl, and $C_7$-$C_{10}$ aryl, and n is an integer of about 3 to about 500, (c) a polyhydroxy aromatic compound, (d) a polyvinyl alcohol, and (e) water, wherein the polishing composition has a pH of about 1 to about 4.5.

The chemical-mechanical polishing composition comprises a ceria abrasive. As known to one of ordinary skill in the art, ceria is an oxide of the rare earth metal cerium, and is also known as ceric oxide, cerium oxide (e.g., cerium(IV) oxide), or cerium dioxide. Cerium(IV) oxide ($CeO_2$) can be formed by calcining cerium oxalate or cerium hydroxide. Cerium also forms cerium(III) oxides such as, for example, $Ce_2O_3$. The ceria abrasive can be any one or more of these or other oxides of ceria.

The ceria abrasive can be of any suitable type. As used herein, "wet-process" ceria refers to a ceria prepared by a precipitation, condensation-polymerization, or similar process (as opposed to, for example, fumed or pyrogenic ceria). A polishing composition of the invention comprising a wet-process ceria abrasive has been typically found to exhibit lower defects when used to polish substrates according to a method of the invention. Without wishing to be bound to a particular theory, it is believed that wet-process ceria comprises spherical ceria particles and/or smaller aggregate ceria particles, thereby resulting in lower substrate defectivity when used in the inventive method. An illustrative wet-process ceria is HC-60™ ceria commercially available from Rhodia.

The ceria particles can have any suitable average size (i.e., average particle diameter). If the average ceria particle size is too small, the polishing composition may not exhibit sufficient removal rate. In contrast, if the average ceria particle size is too large, the polishing composition may exhibit undesirable polishing performance such as, for example, poor substrate defectivity. Accordingly, the ceria particles can have an average particle size of about 10 nm or more, for example, about 15 nm or more, about 20 nm or more, about 25 nm or more, about 30 nm or more, about 35 nm or more, about 40 nm or more, about 45 nm or more, or about 50 nm or more. Alternatively, or in addition, the ceria can have an average particle size of about 1,000 nm or less, for example, about 750 nm or less, about 500 nm or less, about 250 nm or less, about 150 nm or less, about 100 nm or less, about 75 nm or less, or about 50 nm or less. Thus, the ceria can have an average particle size bounded by any two of the aforementioned endpoints. For example, the ceria can have an average particle size of about 10 nm to about 1,000 nm, about 10 nm to about 750 nm, about 15 nm to about 500 nm, about 20 nm to about 250 nm, about 20 nm to about 150 nm, about 25 nm to about 150 nm, about 25 nm to about 100 nm, or about 50 nm to about 150 an, or about 50 nm to about 100 nm. For non-spherical ceria particles, the size of the particle is the diameter of the smallest sphere that encompasses the particle. The particle size of the ceria can be measured using any suitable technique, for example, using laser diffraction techniques. Suitable particle size measurement instruments are available from e.g., Malvern Instruments (Malvern, UK).

The ceria particles preferably are colloidally stable in the inventive polishing composition. The term colloid refers to the suspension of ceria particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., {[B]−[T]}/[C]≤0.5). More preferably, the value of [B]−[T]/[C] is less than or equal to 0.3, and most preferably is less than or equal to 0.1.

The polishing composition can comprise any suitable amount of ceria abrasive. If the polishing composition of the invention comprises too little ceria abrasive, the composition may not exhibit sufficient removal rate. In contrast, if the polishing composition comprises too much ceria abrasive then the polishing composition may exhibit undesirable polishing performance and/or may not be cost effective and/or may lack stability. The polishing composition can comprise about 10 wt. % or less of ceria, for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, about 0.9 wt. % or less, about 0.8 wt. % or less, about 0.7 wt. % or less, about 0.6 wt. % or less of ceria, or about 0.5 wt. % or less of ceria. Alternatively, or in addition, the polishing composition can comprise about 0.1 wt. % or more, for example, about 0.2 wt. % or more, about 0.3 wt. % or more, about 0.4 wt. % or more, about 0.5 wt. % or more, or about 1 wt. % or more of ceria. Thus, the polishing composition can comprise ceria in an amount bounded by any two of the aforementioned endpoints. For example, the polishing composition can comprise about 0.1 wt. % to about 10 wt. % of ceria, about 0.1 wt. % to about 9 wt. %, about 0.1 wt. % to about 8 wt. %, about 0.1 wt. % to about 7 wt. %, about 0.1 wt. % to about 6 wt. %, about 0.1 wt. % to about 5 wt. % of ceria, about 0.1 wt. % to about 4 wt. %, about 0.1 wt. % to about 3 wt. % of ceria, about 0.1 wt. % to about 2 wt. % of ceria, 0.1 wt. % to about 1 wt. % of ceria, about 0.2 wt. % to about 2 wt. % of ceria, about 0.2 wt. % to about 1 wt. % of ceria, or about 0.3 wt. % to about 0.5 wt. % of ceria. In an embodiment, the polishing composition comprises, at point-of-use, about 0.2 wt. % to about 0.6 wt. % of ceria (e.g., about 0.4 wt. % of ceria). In another embodiment, the polishing composition comprises, as a concentrate, about 2.4 wt. % of ceria.

The chemical-mechanical polishing composition comprises an ionic polymer of formula I as described herein.

In certain embodiments, the ionic polymer is of formula I wherein $X^1$ and $X^2$ are both —COOH. In certain embodiments, the ionic polymer is of formula I wherein $Z^1$ and $Z^2$ are both O, and $R^1$, $R^2$, $R^3$, and $R^4$ are hydrogen. In certain preferred embodiments, the ionic polymer is of formula I wherein $X^1$ and $X^2$ are both —COOH, Z and $Z^2$ are both O, and $R^1$, $R^2$, $R^3$, and $R^4$ are hydrogen.

The ionic polymer can have any suitable molecular weight. The ionic polymer can have an average molecular weight of about 250 g/mol or more, for example, about 300 g/mol or more, about 400 g/mol or more, about 500 g/mol or more, about 600 g/mol or more, about 750 g/mol or more, about 1,000 g/mol or more, about 1,500 g/mol or more, about 2,000 g/mol or more, about 2,500 g/mol or more, about 3,000 g/mol or more, about 3,500 g/mol or more, about 4,000 g/mol or more, about 4,500 g/mol or more, about 5,000 g/mol or more, about 5,500 g/mol or more, about 6,000 g/mol or more, about 6.500 g/mol or more, about 7,000 g/mol or more, or about 7,500 g/mol or more. Alternatively, or in addition, the ionic polymer can have an average molecular weight of about 15,000 g/mol or less, for example, about 14,000 g/mol or less, about 13,000 g/mol or less, about 12,000 g/mol or less, about 11,000 g/mol or less, about 10,000 g/mol or less, about 9,000 g/mol or less, about 8,000 g/mol or less, about 7,500 g/mol or less, about 7,000 g/mol or less, about 6,500 g/mol or less, about 6,000 g/mol or less, about 5,500 g/mol or less, about 5,000 g/mol or less, about 4,500 g/mol or less, about 4,000 g/mol or less, about 3.500 g/mol or less, about 3,000 g/mol or less, about 2,500 g/mol or less, or about 2,000 g/mol or less. Thus, the ionic polymer can have an average molecular weight bounded by any two of the aforementioned endpoints. For example, the ionic polymer can have an average molecular weight of about 250 g/mol to about 15,000 g/mol, about 250 g/mol to about 14,000 g/mol, about 250 g/mol to about 13,000 g/mol, about 250 g/mol to about 12,000 g/mol, about 250 g/mol to about 11,000 g/mol, about 250 g/mol to about 10,000 g/mol, about 400 g/mol to about 10,000 g/mol, about 400 g/mol to about 8,000 g/mol, about 400 g/mol to about 6,000 g/mol, about 400 g/mol to about 4,000 g/mol, about 400 g/mol to about 2,000 g/mol, and the like.

The polishing composition comprises any suitable amount of ionic polymer at the point-of-use. The polishing composition can comprise about 0.001 wt. % or more, for example, about 0.005 wt. % or more, about 0.01 wt. % or more, about 0.025 wt. % or more, about 0.05 wt. % or more, about 0.075 wt. % or more, or about 0.1 wt. % or more, of the ionic polymer. Alternatively, or in addition, the polishing composition can comprise about 1 wt. % or less, for example, about 0.9 wt. % or less, about 0.8 wt. % or less, about 0.7 wt. % or less, about 0.6 wt. % or less, about 0.5 wt. % or less, about 0.4 wt. % or less, or about 0.3 wt. % or less, of the ionic polymer. Thus, the polishing composition can comprise the ionic polymer in an amount bounded by any two of the aforementioned endpoints. For example, the polishing composition can comprise about 0.001 wt. % to about 1 wt. %, about 0.01 wt. % to about 0.9 wt. %, about 0.025 wt. % to about 0.8 wt. %, about 0.05 wt. % to about 0.7 wt. %, or about 0.1 wt. % to about 0.5 wt. % of the ionic polymer, and the like.

The chemical-mechanical polishing composition comprises one or more polyvinyl alcohols. The polyvinyl alcohol can be any suitable polyvinyl alcohol and can be a linear or branched polyvinyl alcohol. Non-limiting examples of suitable branched polyvinyl alcohols are the Nichigo G-polymers, such as the OKS-1009 and OKS-1083 products, available from Nippon Gohsei, Japan.

The polyvinyl alcohol can have any suitable degree of hydrolysis. The degree of hydrolysis refers to the amount of free hydroxyl groups present on the polyvinyl alcohol as compared with the sum of free hydroxyl groups and acetylated hydroxyl groups. Preferably, the polyvinyl alcohol has a degree of hydrolysis of about 90% or more, e.g., about 92% or more, about 94% or more, about 96% or more, about 98% or more, or about 99% or more.

The polyvinyl alcohol can have any suitable molecular weight. The polyvinyl alcohol can have an average molecular weight of about 250 g/mol or more, for example, about 300 g/mol or more, about 400 g/mol or more, about 500 g/mol or more, about 600 g/mol or more, about 750 g/mol or more, about 1,000 g/mol or more, about 2,000 g/mol or more, about 3,000 g/mol or more, about 4,000 g/mol or more, about 5,000 g/mol or more, about 7,500 g/mol or more, about 10,000 g/mol or more, about 15,000 g/mol or more, about 20,000 g/mol or more, about 25,000 g/mol or more, about 30,000 g/mol or more, about 50,000 g/mol or more, or about 75,000 g/mol or more. Alternatively, or in addition, the polyvinyl alcohol can have an average molecular weight of about 250,000 g/mol or less, for example, about 200,000 g/mol or less, about 180,000 g/mol or less, about 150.000 g/mol or less, about 100,000 g/mol or less, about 90,000 g/mol or less, about 85,000 g/mol or less, about 80,000 g/mol or less, about 75,000 g/mol or less, about 50,000 g/mol or less, about 45,000 g/mol or less, about 40,000 g/mol or less, about 35,000 g/mol or less, about 30,000 g/mol or less, about 25,000 g/mol or less, about 20,000 g/mol or less, about 15,000 g/mol or less, about 12.500 g/mol or less, or about 10,000 g/mol or less. Thus, the polyvinyl alcohol can have an average molecular weight bounded by any two of the aforementioned endpoints. For example, the polyvinyl alcohol can have an average molecular weight of about 250 g/mol to about 250,000 g/mol, 250 g/mol to about 200,000 g/mol, 250 g/mol to about 180,000 g/mol, 250 g/mol to about 150.000 g/mol, 250 g/mol to about 100,000 g/mol, about 250 g/mol to about 75,000 g/mol, about 250 g/mol to about 50,000 g/mol, about 250 g/mol to about 25,000 g/mol, about 250 g/mol to about 10,000 g/mol, about 10,000 g/mol to about 100,000 g/mol, about 10,000 g/mol to about 75,000 g/mol, about 10,000 g/mol to about 50,000 g/mol, about 10,000 g/mol to about 40,000 g/mol, about 50,000 g/mol to about 100,000 g/mol, about 75,000 g/mol to about 100,000 g/mol, about 25,000 g/mol to about 200,000 g/mol, or about 50,000 g/mol to about 180,000 g/mol, and the like.

The polishing composition comprises any suitable amount of polyvinyl alcohol at the point-of-use. The polishing composition can comprise about 0.001 wt. % or more, for example, about 0.005 wt. % or more, about 0.01 wt. % or more, about 0.025 wt. % or more, about 0.05 wt. % or more, about 0.075 wt. % or more, or about 0.1 wt. % or more, of the polyvinyl alcohol. Alternatively, or in addition, the polishing composition can comprise about 1 wt. % or less, for example, about 0.9 wt. % or less, about 0.8 wt. % or less, about 0.7 wt. % or less, about 0.6 wt. % or less, about 0.5 wt. % or less, about 0.4 wt. % or less, or about 0.3 wt. % or less, of the polyvinyl alcohol. Thus, the polishing composition can comprise the ionic polymer in an amount bounded by any two of the aforementioned endpoints. For example, the polishing composition can comprise about 0.001 wt. % to about 1 wt. %, about 0.01 wt. % to about 0.9 wt. %, about 0.025 wt. % to about 0.8 wt. %, about 0.05 wt. % to about 0.7 wt. %, or about 0.1 wt. % to about 0.5 wt. % of the polyvinyl alcohol, and the like.

The chemical-mechanical polishing composition comprises a polyhydroxy aromatic compound. The polyhydroxy aromatic compound can be any suitable polyhydroxy aromatic compound. The term polyhydroxy aromatic compound refers to an aryl compound or heteroaryl compound having two or more hydroxyl groups bonded to the aryl or heteroaryl ring. Non-limiting examples of suitable polyhydroxy aromatic compounds include 1,2-dihydroxybenzene, 1,3-dihydroxybenzene, 1,4-dihydroxybenzene, 1,3,5-trihydroxybenzene, 1,2,4-trihydroxybenzene, 2,6-dihydroxypyridine, 2,3-dihydroxypyridine, and 2,4-dihydroxypyridine. In preferred embodiments, the polyhydroxy aromatic compound is selected from 1,3-dihydroxybenzene and 1,3,5-trihydroxybenzene.

The polishing composition comprises any suitable amount of polyhydroxy aromatic compound at the point-of-use. The polishing composition can comprise about 0.001 wt. % or more, for example, about 0.005 wt. % or more, about 0.01 wt. % or more, about 0.025 wt. % or more, about 0.05 wt. % or more, about 0.075 wt. % or more, or about 0.1 wt. % or more, of the polyhydroxy aromatic compound. Alternatively, or in addition, the polishing composition can comprise about 1 wt. % or less, for example, about 0.9 wt. % or less, about 0.8 wt. % or less, about 0.7 wt. % or less, about 0.6 wt. % or less, about 0.5 wt. % or less, about 0.4 wt. % or less, or about 0.3 wt. % or less, of the polyhydroxy aromatic compound. Thus, the polishing composition can comprise the polyhydroxy aromatic compound in an amount bounded by any two of the aforementioned endpoints. For example, the polishing composition can comprise about 0.001 wt. % to about 1 wt. %, about 0.01 wt. % to about 0.9 wt. %, about 0.025 wt. % to about 0.8 wt. %, about 0.05 wt. % to about 0.7 wt. %, or about 0.1 wt. % to about 0.5 wt. % of the polyhydroxy aromatic compound, and the like.

The chemical-mechanical polishing composition can comprise one or more compounds capable of adjusting (i.e., that adjust) the pH of the polishing composition (i.e., pH adjusting compounds). The pH of the polishing composition can be adjusted using any suitable compound capable of adjusting the pH of the polishing composition. The pH adjusting compound desirably is water-soluble and compatible with the other components of the polishing composition. Typically, the chemical-mechanical polishing composition has a pH of about 1 to about 7 at the point-of-use. Preferably, the chemical-mechanical polishing composition has a pH of about 1 to about 4.5 at the point-of-use.

Ionic polymers of formula (I) are acidic in nature. As a consequence, the inventive polishing composition can be formulated to provide buffering capability. Typically, buffering of the polishing composition can be accomplished by addition of a basic compound or compounds to adjust the pH value of the polishing composition to a value in the range of the pKa value or pKa values of the ionic polymer. Any suitable basic compound may be used to adjust the pH value to provide for buffering capability. Non-limiting examples of suitable basic compounds include sodium hydroxide, potassium hydroxide, ammonium hydroxide, and organic amines such as triethanolamine.

In other embodiments, it is desirable that another compound capable of adjusting the pH and which is separately capable of buffering an acidic pH of the polishing composition can be added. Accordingly, in either of these embodiments, it is desirable that the pH of the polishing composition is less than 7.0 (e.g., 6.5+/−0.5, 6.0+/−0.5, 5.5+/−0.5, 5.0+/−0.5, 4.5+/−0.5, 4.0+/−0.5, 3.5+/−0.5, 3.0+/−0.5, 2.5+/−0.5, 2.0+/−0.5, 1.5+/−0.5, or 1.0+/−0.5). Typically, the pH of the polishing composition in either of these embodiments is about 1 to about 4.5 at the point-of-use. Thus, the compound capable of adjusting the pH of the polishing composition typically has at least one ionizable group having a pKa of about 3 to about 7 when measured at 25° C.

The compound capable of adjusting and buffering the pH can be selected from the group consisting of ammonium salts, alkali metal salts, carboxylic acids, alkali metal hydroxides, alkali metal carbonates, alkali metal bicarbonates, borates, and mixtures thereof.

The chemical-mechanical polishing composition optionally further comprises one or more additives. Illustrative additives include conditioners, acids (e.g., sulfonic acids), complexing agents (e.g., anionic polymeric complexing agents), chelating agents, biocides, scale inhibitors, dispersants, etc.

A biocide, when present, can be any suitable biocide and can be present in the polishing composition in any suitable amount. A suitable biocide is an isothiazolinone biocide. The amount of biocide used in the polishing composition typically is about 1 to about 50 ppm, preferably about 10 to about 20 ppm.

It will be understood that any of the components of the polishing composition that are acids, bases, or salts (e.g., organic carboxylic acid, base, and/or alkali metal carbonate, etc.), when dissolved in the water of the polishing composition, can exist in dissociated form as cations and anions. The amounts of such compounds present in the polishing composition as recited herein will be understood to refer to the weight of the undissociated compound used in the preparation of the polishing composition.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., ceria abrasive, ionic polymer, polyhydroxy aromatic compound, polyvinyl alcohol, optional pH adjustor, and/or any optional additive) as well as any combination of ingredients (e.g., ceria abrasive, ionic polymer, polyhydroxy aromatic compound, polyvinyl alcohol, etc.).

For example, the polishing composition can be prepared by (i) providing all or a portion of the liquid carrier, (ii) dispersing the ceria abrasive, ionic polymer, polyhydroxy aromatic compound, polyvinyl alcohol, optional pH adjustor, and/or any optional additive, using any suitable means for preparing such a dispersion, (iii) adjusting the pH of the dispersion as appropriate, and (iv) optionally adding suitable amounts of any other optional components and/or additives to the mixture.

Alternatively, the polishing composition can be prepared by (i) providing one or more components (e.g., liquid carrier, polyhydroxy aromatic compound, polyvinyl alcohol, optional pH adjustor, and/or any optional additive) in a cerium oxide slurry, (ii) providing one or more components in an additive solution (e.g., liquid carrier, ionic polymer, polyhydroxy aromatic compound, polyvinyl alcohol, optional pH adjustor, and/or any optional additive), (iii) combining the cerium oxide slurry and the additive solution to form a mixture, (iv) optionally adding suitable amounts of any other optional additives to the mixture, and (v) adjusting the pH of the mixture as appropriate.

The polishing composition can be supplied as a one-package system comprising a ceria abrasive, ionic polymer, polyhydroxy aromatic compound, polyvinyl alcohol, optional pH adjustor, and/or any optional additive, and water. Alternatively, the polishing composition of the invention is supplied as a two-package system comprising a cerium oxide slurry and an additive solution, wherein the ceria oxide slurry consists essentially of, or consists of, a ceria abrasive and/or any optional additive, and water, and wherein the additive solution consists essentially of, or consists of, ionic polymer, polyhydroxy aromatic compound, polyvinyl alcohol, optional pH adjustor, and/or any optional additive. The two-package system allows for the adjustment of substrate global flattening characteristics and polishing speed by changing the blending ratio of the two packages, i.e., the cerium oxide slurry and the additive solution.

Various methods can be employed to utilize such a two-package polishing system. For example, the cerium oxide slurry and additive solution can be delivered to the polishing table by different pipes that are joined and connected at the outlet of supply piping. The cerium oxide slurry and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

Similarly, a three-, four-, or more package system can be utilized in connection with the invention, wherein each of multiple containers contains different components of the inventive chemical-mechanical polishing composition, one or more optional components, and/or one or more of the same components in different concentrations.

In order to mix components contained in two or more storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). By the term "flow line" is meant a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if the components are combined about 5 minutes or less prior to being added in mixed form onto the platen, for example, about 4 minutes or less, about 3 minutes or less, about 2 minutes or less, about 1 minute or less, about 45 s or less, about 30 s or less, about 10 s or less prior to being added in mixed form onto the platen, or simultaneously to the delivery of the components at the point-of-use (e.g., the components are combined at a dispenser). Components also are combined "immediately before delivery to the point-of-use" if the components are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the ceria abrasive, ionic polymer, polyhydroxy aromatic compound, polyvinyl alcohol, optional pH adjustor, and/or any optional additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the ceria abrasive, ionic polymer, polyhydroxy aromatic compound, polyvinyl alcohol, optional pH adjustor, and/or any optional additive are at least partially or fully dissolved in the concentrate.

The invention also provides a method of chemically-mechanically polishing a substrate comprising (i) contacting a substrate with a polishing pad and the chemical-mechanical polishing composition as described herein, (ii) moving the polishing pad relative to the substrate with the chemical-mechanical polishing composition therebetween, and (iii) abrading at least a portion of the substrate to polish the substrate.

The chemical-mechanical polishing composition can be used to polish any suitable substrate and is especially useful for polishing substrates comprising at least one layer (typically a surface layer) comprised of a low dielectric material. Suitable substrates include wafers used in the semiconductor industry. The wafers typically comprise or consist of, for example, a metal, metal oxide, metal nitride, metal composite, metal alloy, a low dielectric material, or combinations thereof. The method of the invention is particularly useful for polishing substrates comprising silicon oxide, silicon nitride, and/or polysilicon, e.g., any one, two, or especially all three of the aforementioned materials.

In certain embodiments, the substrate comprises polysilicon in combination with silicon oxide and/or silicon nitride. The polysilicon can be any suitable polysilicon, many of which are known in the art. The polysilicon can have any suitable phase, and can be amorphous, crystalline, or a combination thereof. The silicon oxide similarly can be any suitable silicon oxide, many of which are known in the art. Suitable types of silicon oxide include but are not limited to borophosphosilicate glass (BPSG), PETEOS, thermal oxide, undoped silicate glass, and HDP oxide.

The chemical-mechanical polishing composition of the invention desirably exhibits a high removal rate when polishing a substrate comprising silicon oxide according to a method of the invention. For example, when polishing silicon wafers comprising high density plasma (HDP) oxides and/or plasma-enhanced tetraethyl ortho silicate (PETEOS) and/or tetraethyl orthosilicate (TEOS) in accordance with an embodiment of the invention, the polishing composition desirably exhibits a silicon oxide removal rate of about 500 Å/min or higher, 700 Å/min or higher, about 1,000 Å/min or higher, about 1,250 Å/min or higher, about 1,500 Å/min or higher, about 1,750 Å/min or higher, about 2,000 Å/min or higher, about 2,500 Å/min or higher, about 3,000 Å/min or higher, about 3,500 Å/min or higher. In an embodiment, removal rate for silicon oxide can be about 4,000 Å/min or higher, about 4,500 Å/min or higher, or about 5,000 Å/min or higher.

The chemical-mechanical polishing composition of the invention desirably exhibits a low removal rate when polishing a substrate comprising silicon nitride according to a method of the invention. For example, when polishing silicon wafers comprising silicon nitride in accordance with an embodiment of the invention, the polishing composition desirably exhibits a removal rate of the silicon nitride of about 250 Å/min or lower, for example, about 200 Å/min or lower, about 150 Å/min or lower, about 100 Å/min or lower, about 75 Å/min or lower, about 50 Å/min or lower, or even about 25 Å/min or lower.

The chemical-mechanical polishing composition of the invention desirably exhibits a low removal rate when polishing a substrate comprising polysilicon according to a method of the invention. For example, when polishing silicon wafers comprising polysilicon in accordance with an embodiment of the invention, the polishing composition desirably exhibits a removal rate of polysilicon of about 1,000 Å/min or lower, about 750 Å/min or lower, about 500 Å/min or lower, about 250 Å/min or lower, about 100 Å/min or lower, about 50 Å/min or lower, about 25 Å/min or lower, about 10 Å/min or lower, or even about 5 Å/min or lower.

The chemical-mechanical polishing composition of the invention desirably exhibits reduced dishing when used to polish substrates comprising silicon oxide and silicon nitride, particularly when used in a shallow trench isolation (STI) process. In an STI process, polishing is typically continued after the silicon nitride layer is exposed to ensure complete removal of silicon oxide from the silicon nitride surface. During this overpolishing period, silicon oxide remaining in the trench can continue to be removed, such that the surface of the silicon oxide remaining in the trench is lower than the surface of the silicon nitride, which results in the phenomenon referred to as dishing. Without wishing to be bound by any particular theory, it is believed that the polyhydroxy aromatic compound selectively binds to the surface of the silicon oxide present in the trench, thereby inhibiting further removal of the silicon oxide.

A substrate, especially silicon comprising silicon oxide and/or silicon nitride and/or polysilicon, polished with the inventive polishing composition desirably has a dishing that is about 500 Å or less, e.g., about 500 Å or less, about 450 Å or less, about 400 Å or less, about 350 Å or less, about 300 Å or less, about 250 Å or less, about 200 Å or less, about 150 Å or less, about 100 Å or less, or about 50 Å or less.

The polishing composition of the invention desirably exhibits low particle defects when polishing a substrate, as determined by suitable techniques. In a preferred embodiment, the chemical-mechanical polishing composition of the invention comprises a wet-process ceria which contributes to the low defectivity. Particle defects on a substrate polished with the inventive polishing composition can be determined by any suitable technique. For example, laser light scattering techniques, such as dark field normal beam composite (DCN) and dark field oblique beam composite (DCO), can be used to determine particle defects on polished substrates. Suitable instrumentation for evaluating particle defectivity is available from, for example, KLA-Tencor (e.g., SURFSCAN™ SP1 instruments operating at a 120 nm threshold or at 160 nm threshold).

A substrate, especially silicon comprising silicon oxide and/or silicon nitride and/or polysilicon, polished with the inventive polishing composition desirably has a DCN value of about 20,000 counts or less, e.g., about 17,500 counts or less, about 15,000 counts or less, about 12,500 counts or less, about 3,500 counts or less, about 3,000 counts or less, about 2,500 counts or less, about 2,000 counts or less, about 1,500 counts or less, or about 1,000 counts or less. Preferably substrates polished in accordance with an embodiment of the invention has a DCN value of about 750 counts or less, about 500 counts, about 250 counts, about 125 counts, or even about 100 counts or less. Alternatively, or in addition, a substrate polishing with the chemical-mechanical polishing composition of the invention desirably exhibits low scratches as determined by suitable techniques. For example, silicon wafers polished in accordance with an embodiment of the invention desirably have about 250 scratches or less, or about 125 scratches or less, as determined by any suitable method known in the art.

The chemical-mechanical polishing composition of the invention can be tailored to provide effective polishing at the desired polishing ranges selective to specific thin layer materials, while at the same time minimizing surface imperfections, defects, corrosion, erosion and the removal of stop layers. The selectivity can be controlled, to some extent, by altering the relative concentrations of the components of the polishing composition. When desirable, the chemical-mechanical polishing composition of the invention can be used to polish a substrate with a silicon dioxide to silicon nitride polishing selectivity of about 5:1 or higher (e.g., about 10:1 or higher, about 15:1 or higher, about 25:1 or higher, about 50:1 or higher, about 100:1 or higher, or about 150:1 or even higher). When desirable, the chemical-mechanical polishing composition of the invention can be used to polish a substrate with a silicon dioxide to polysilicon polishing selectivity of about 5:1 or higher (e.g., about 10:1 or higher, about 15:1 or higher, about 25:1 or higher, about 50:1 or higher, about 100:1 or higher, or about 150:1 or even higher). Also, the chemical-mechanical polishing composition of the invention can be used to polish a substrate with a silicon nitride to polysilicon polishing selectivity of about 2:1 or higher (e.g., about 4:1 or higher, or about 6:1 or higher). Certain formulations can exhibit even higher silicon dioxide to polysilicon selectivities, such as about 20:1 or higher, or even about 30:1 or higher. In a preferred embodiment, the chemical-mechanical polishing composition of the invention simultaneously provides selective polishing of silicon dioxide relative to silicon nitride and selective polishing of silicon dioxide relative to polysilicon.

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSWI, SPM3100 (commercially available from, for example, Eminess Technologies), POLITEX™, and Fujibo POLYPAS™ 27. A particularly preferred polishing pad is the EPIC™ D100 pad commercially available from Cabot Microelectronics. Another preferred polishing pad is the IC1010 pad available from Dow, Inc.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a substrate being polished enables the determination of the polishing endpoint, i.e., the determination of when to terminate the polishing process with respect to a particular substrate.

The following examples further illustrate the invention but, of course, should not be construed as in any way limiting its scope.

Example 1

This example demonstrates the advantage of inventive compositions with polyhydroxy aromatic compound on dishing in the polishing of patterned silicon nitride substrates. The patterned (Shallow Trench Isolation (STI)) wafers were obtained from Sylib Wafers and prepared prior to running the experiment by first polishing with a bulk oxide slurry to remove approximately 0.2 µm silicon oxide overburden. An example of a suitable bulk oxide slurry for wafer preparation is Semi-Sperse 25 (SS-25) available from Cabot Microelectronics Corp.

Five separate patterned substrates (obtained from Sylib Wafers) comprising 0.2 µm silicon oxide coated on 0.16 silicon nitride features on a silicon substrate were polished with five different polishing compositions, i.e., Polishing Compositions A-E. Each of the polishing compositions contained 0.2 wt. % wet-process ceria, 0.06 wt. % of a polyvinyl alcohol, 0.06 wt. % of a polyethylene glycol biscarboxylic acid, and 0.0075% of a biocide, in water at a pH of 3.6. Polishing Composition 1A (control) did not contain any polyhydroxy aromatic compound. Polishing Composition 1B (invention) further comprised 1,3,5-trihydroxybenzene (i.e., a polyhydroxy aromatic compound). Polishing Composition 1C (invention) further comprised 1,3-dihydroxybenzene (i.e., a polyhydroxy aromatic compound). Polishing Composition 1D (comparative) further comprised 3,5-pyridinedimethanol. Polishing Composition 1E (comparative) further comprised 1,3-benzenedimethanol.

Following polishing, the active oxide removal rate ($A_{RR}$), trench oxide removal rate ($T_{RR}$), ratio of active oxide to trench oxide removal rate ($A_{RR}/T_{RR}$), and dishing were determined. The results are set forth in the Table 1.

TABLE 1

Pattern Oxide Removal Rates and Dishing.

| Composition | Polyhydroxy Aromatic Compound | Active oxide removal rate ($A_{RR}$) (Å/min) | Trench oxide removal rate ($T_{RR}$) (Å/min) | $A_{RR}/T_{RR}$ | Dishing (Å) |
|---|---|---|---|---|---|
| 1A | None (control) | 2553 | 1718 | 1.48 | 454 |
| 1B | 1,3,5-trihydroxy-benzene (invention) | 2440 | 1448 | 1.68 | 87 |
| 1C | 1.3-dihydroxy-benzene (invention) | 2346 | 1459 | 1.61 | 36 |
| 1D | 3,5-pyridine-dimethanol (comparative) | 1561 | 1021 | 1.53 | 342 |
| 1E | 1,3-benzene-dimethanol (comparative) | 2460 | 1599 | 1.54 | 319 |

As is apparent from the results set forth in Table 1, Polishing Compositions 1B and 1C comprising a polyhydroxy aromatic compound exhibited reduced dishing as compared to Polishing Compositions 1A, 1D, and 1E, which did not comprise a polyhydroxy aromatic compound, when used to polish patterned substrates comprising 100 µm silicon nitride features on silicon oxide-coated substrates. In particular, Polishing Composition C, comprising 1.3-dihydroxybenzene, exhibited an approximately 92% reduction in dishing as compared to Polishing Composition 1A.

Example 2

This example demonstrates the advantage of compositions of the invention comprising polyhydroxy aromatic compounds, with regard to dishing in the polishing of patterned silicon nitride substrates with extended overpolish.

Six separate STI patterned substrates prepared as described in Example 1 were polished with two different polishing compositions, i.e., Polishing Compositions 2A and 2B. Each of the polishing compositions contained 0.2 wt. % wet-process ceria, 0.06 wt. % of a polyvinyl alcohol, 0.06 wt. % of a polyethylene glycol biscarboxylic acid, and 0.0075% of a biocide, in water at a pH of 3.6. Polishing Composition 2A (comparison) did not contain polyhydroxy aromatic compounds. Polishing Composition 2B (invention) further comprised 1,3,5-trihydroxybenzene (i.e., a polyhydroxy aromatic compound). Three different patterned wafers were polished under three overpolish conditions: 40%, 60% and 100% with each slurry (2A and 2B).

Following polishing, dishing at 100 µm feature was measured for each pattern wafer at each overpolish condition. The results are set forth in Table 2.

TABLE 2

Pattern Performance with Overpolish (OP)

| Composition | Dishing (Å) (100 μm feature) at 40% OP | Dishing (Å) (100 μm feature) at 70% OP | Dishing (Å) (100 μm feature) at 100% OP |
|---|---|---|---|
| 2A (comparative) | 600 | 850 | 1200 |
| 2B (invention) | 100 | 350 | 550 |

As is evident from the data presented in Table 2, Polishing Composition 2B comprising a polyhydroxy aromatic compound showed significantly reduced dishing under all of the overpolish conditions as compared to Composition 2A. For example, at 100% OP, the inventive composition 2B exhibited less than half the dishing observed with the comparative composition 2A.

Example 3

This example demonstrates the advantage of inventive compositions comprising polyhydroxy aromatic compounds with regard to high stop on nitride capability on pattern wafers.

Six separate patterned substrates separate STI patterned substrates having 100 μm silicon nitride features prepared as described in Example 1 were polished with two different polishing compositions, i.e., Polishing Compositions 3A and 3B. Each of the polishing compositions contained 0.2 wt. % wet-process ceria, 0.06 wt. % of a polyvinyl alcohol, 0.06 wt. % of a polyethylene glycol biscarboxylic acid, and 0.0075% of a biocide, in water at a pH of 3.6. Polishing Composition 3A (control) did not contain any polyhydroxy aromatic compound. Polishing Composition 3B (invention) further comprised 1,3,5-trihydroxybenzene (i.e., a polyhydroxy aromatic compound). Three different patterned wafers were polished for 40%, 70% and 100% over polish with polishing composition 3A (control) and 3B (invention).

Following polishing, nitride loss at the 100 μm feature was measured for each pattern. The results are set forth in Table 3.

TABLE 3

Pattern Silicon Nitride (SiN) Loss with Overpolish (OP)

| Composition | SiN Loss (Å) (100 μm feature) at 40% OP | SiN Loss (Å) (100 μm feature) at 70% OP | SiN Loss (Å) (100 μm feature) at 100% OP |
|---|---|---|---|
| 3A (comparative) | 14 | 28 | 38 |
| 3B (invention) | nd | nd | 5 |

Nd = not detected, i.e., SiN loss is less than 3 Å.

As is evident from the data presented in Table 3, Polishing Composition 3B comprising a polyhydroxy aromatic compound showed significantly reduced SiN loss at all of the overpolish conditions as compared to Composition 3A. For example, at 100% OP, the inventive composition 3B exhibited less than 15% of the SiN Loss as compared to composition 3A.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) a wet-process ceria abrasive,
   (b) an ionic polymer of formula (I):

$$X^1 - \overset{R^4}{\underset{}{C}} - Z^1 - \left[ \overset{R^1}{\underset{R^2}{C}} \right]_n - Z^2 - \overset{R^3}{\underset{}{C}} - X^2 \quad (I)$$

wherein $X^1$ and $X^2$ are independently selected from hydrogen, —OH, and —COOH and wherein at least one of $X^1$ and $X^2$ is —COOH,
   $Z^1$ and $Z^2$ are independently O or S,
   $R^1$, $R^2$, $R^3$, and $R^4$ are independently selected from hydrogen, $C_1$-$C_6$ alkyl, and $C_7$-$C_{10}$ aryl, and
   n is an integer of about 3 to about 500,
   (c) a polyhydroxy aromatic compound,
   (d) a polyvinyl alcohol, and
   (e) water,
   wherein the polishing composition has a pH of about 1 to about 4.5.

2. The polishing composition of claim 1, wherein $X^1$ and $X^2$ are both —COOH.

3. The polishing composition of claim 2, wherein $Z^1$ and $Z^2$ are both O, and $R^1$, $R^2$, $R^3$, and $R^4$ are hydrogen.

4. The polishing composition of claim 1, wherein the ionic polymer has a molecular weight of about 500 daltons to about 10,000 daltons, and wherein n is an integer with a value of 8 or greater.

5. The polishing composition of claim 1, wherein the ionic polymer is present in an amount of about 0.01 wt. % to about 0.5 wt. % of the polishing composition.

6. The polishing composition of claim 1, wherein the wet-process ceria abrasive is present in an amount of about 0.05 wt. % to about 1 wt. % of the polishing composition.

7. The polishing composition of claim 1, wherein the polyvinyl alcohol has a molecular weight of about 20,000 daltons to about 200,000 daltons.

8. The polishing composition of claim 1, wherein the polyvinyl alcohol is a branched polyvinyl alcohol.

9. The polishing composition of claim 1, wherein the polyhydroxy aromatic compound is selected from 1,3-dihydroxybenzene and 1,3,5-trihydroxybenzene.

10. A method of chemically-mechanically polishing a substrate comprising:
   (i) contacting a substrate with a polishing pad and a chemical-mechanical polishing composition comprising:
   (a) a wet-process ceria abrasive,
   (b) an ionic polymer of formula (I):

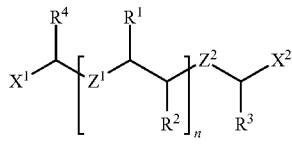

(I)

wherein $X^1$ and $X^2$ are independently selected from hydrogen, —OH, and —COOH and wherein at least one of $X^1$ and $X^2$ is —COOH, $Z^1$ and $Z^2$ are independently O or S, $R^1$, $R^2$, $R^3$ and $R^4$ are independently selected from hydrogen, $C_1$-$C_6$ alkyl, and $C_7$-$C_{10}$ aryl, and n is an integer of about 3 to about 500,
   (c) a polyhydroxy aromatic compound,
   (d) a polyvinyl alcohol, and
   (e) water,
   wherein the polishing composition has a pH of about 1 to about 4.5,
   (ii) moving the polishing pad and the chemical-mechanical polishing composition relative to the substrate, and
   (iii) abrading at least a portion of the substrate to polish the substrate.

11. The method of claim 10, wherein $X^1$ and $X^2$ are both —COOH.

12. The method of claim 11, wherein $Z^1$ and $Z^2$ are both O, and $R^1$, $R^2$, $R^3$, and $R^4$ are hydrogen.

13. The method of claim 10, wherein the ionic polymer has a molecular weight of about 500 daltons to about 10,000 daltons, and wherein n is an integer with a value of 8 or greater.

14. The method of claim 10, wherein the ionic polymer is present in an amount of about 0.01 wt. % to about 0.5 wt. % of the polishing composition.

15. The method of claim 10, wherein the wet-process ceria abrasive is present in an amount of about 0.1 wt. % to about 1 wt. % of the polishing composition.

16. The method of claim 10, wherein the polyvinyl alcohol has a molecular weight of about 20,000 daltons to about 200,000 daltons.

17. The method of claim 10, wherein the polyvinyl alcohol is a branched polyvinyl alcohol.

18. The method of claim 10, wherein the polyhydroxy aromatic compound is selected from 1,3-dihydroxybenzene and 1,3,5-trihydroxybenzene.

19. The method of claim 10, wherein the substrate comprises silicon oxide, and wherein at least a portion of the silicon oxide is abraded to polish the substrate.

20. The method of claim 19, wherein the substrate further comprises silicon nitride, and wherein at least a portion of the silicon nitride is abraded to polish the substrate.

21. The method of claim 19, wherein the substrate further comprises polysilicon, and wherein at least a portion of the polysilicon is abraded to polish the substrate.

* * * * *